(12) United States Patent
Cullen

(10) Patent No.: US 6,762,073 B1
(45) Date of Patent: Jul. 13, 2004

(54) METHOD OF FABRICATING ELECTRONIC INTERCONNECT DEVICES USING DIRECT IMAGING OF DIELECTRIC COMPOSITE MATERIAL

(76) Inventor: Donald P. Cullen, 96 Kimberly La., Watertown, CT (US) 06795

( * ) Notice: Subject to any disclaimer, the term of this patent is extended or adjusted under 35 U.S.C. 154(b) by 0 days.

(21) Appl. No.: 10/372,747

(22) Filed: Feb. 24, 2003

(51) Int. Cl.[7] .............................................. H01L 51/40
(52) U.S. Cl. ............................. 438/99; 257/24; 257/368
(58) Field of Search .......................... 438/99; 430/311; 427/227, 592; 257/9, 24, 368

(56) References Cited

U.S. PATENT DOCUMENTS

| | | | |
|---|---|---|---|
| 5,576,162 A | | 11/1996 | Papadopoulos |
| 5,592,737 A | | 1/1997 | Middelman et al. |
| 6,031,711 A | | 2/2000 | Tennent et al. |
| 6,057,637 A | * | 5/2000 | Zettl et al. .................. 313/310 |
| 6,239,547 B1 | * | 5/2001 | Uemura et al. ............. 313/495 |
| 6,297,063 B1 | | 10/2001 | Brown et al. |
| 6,420,092 B1 | | 7/2002 | Yang et al. |
| 6,423,583 B1 | | 7/2002 | Avouris et al. |
| 6,472,705 B1 | | 10/2002 | Bethune et al. |
| 6,576,341 B1 | * | 6/2003 | Davey et al. ............... 428/376 |
| 6,599,961 B1 | * | 7/2003 | Pienkowski et al. ........ 523/120 |
| 6,669,256 B2 | * | 12/2003 | Nakayama et al. ........ 294/99.1 |
| 2001/0023986 A1 | | 9/2001 | Mancevski |
| 2002/0135105 A1 | | 9/2002 | Easter |
| 2002/0150524 A1 | | 10/2002 | Smalley et al. |
| 2002/0173083 A1 | | 11/2002 | Avouris et al. |
| 2002/0180077 A1 | * | 12/2002 | Glatkowski et al. ........ 264/36.1 |
| 2002/0183438 A1 | * | 12/2002 | Amaraseka et al. ......... 524/495 |
| 2003/0008123 A1 | * | 1/2003 | Glatkowski et al. ..... 428/294.4 |
| 2003/0181568 A1 | * | 9/2003 | Amaraseka et al. ........ 524/495 |

OTHER PUBLICATIONS

Single–Walled Carbon Nanotube Electronics, Paul L. McEuen, et al., IEEE Transactions on Nanotechnology, vol. 1, No. 1, Mar. 2002, pp. 78–85.

Nanotubes In A Flash–Ignition and Reconstruction, P. M. Ajayan, et al., Science Magazine, vol. 296, No. 5568, Apr. 26, 2002, p. 705.

* cited by examiner

*Primary Examiner*—Maria Guerrero
(74) *Attorney, Agent, or Firm*—Carmody & Torrance LLP

(57) ABSTRACT

An improved method of fabricating an electronic interconnect device using direct imaging of dielectric composite material by the inclusion of a conducting material in the composite material that becomes non-conducting through exposure to electromagnetic radiation. The conducting material generally comprises singe-wall carbon nanotubes. The dielectric composite material comprising carbon nanotubes is selectively exposed to electromagnetic radiation so that defined portions of the composite are conducting and other portions are insulating.

12 Claims, No Drawings

METHOD OF FABRICATING ELECTRONIC INTERCONNECT DEVICES USING DIRECT IMAGING OF DIELECTRIC COMPOSITE MATERIAL

FIELD OF THE INVENTION

The present invention relates to a method of fabricating an electronic interconnect device using direct imaging of dielectric composite material by the inclusion of a conducting material in the composite material that becomes non-conducting through exposure to electromagnetic radiation.

BACKGROUND OF THE INVENTION

Since the 1970s, carbon nanotubes (or nanofibers) have been identified as materials of interest for a variety of applications. Nanotubes have been contemplated for use in such products as compact fuel cells, fluorescent lights, and sensors.

Carbon nanotubes are two-dimensional sheets of graphite that are rolled and joined into tubular structures. In graphite, the orbits of its outer electrons form three lobes that flare outward at 120-degree angles. Graphene, a singe atomic layer of graphite, consists of a two-dimensional honeycomb structure of bonded carbon atoms. Each lobe bonds with a lobe of a neighboring carbon atom, forming a honeycomb pattern, forming bonds between the carbon atoms that are stronger than those of diamond. Graphite becomes extremely stiff, when the opposite edges of a rectangular sheet are connected to form a cylinder (nanotube). Carbon nanotubes generally have diameters in the range of from 1 to 100 nanometers and may range in length up to about 100 micrometers, although other diameters and lengths are possible.

Carbon nanotubes can have either a single-wall construction (SWNT) or a multi-wall construction (MWNT). Single-wall carbon nanotubes are more pure conductors than multi-wall carbon nanotubes and generally have a diameter of approximately 1 to 4 nanometers. On the other hand, multi-wall carbon nanotubes generally have a diameter of approximately 2 to 40 nanometers. Multi-wall carbon nanotubes can range from metallic to insulating, and because there may be differences between each tube in a multi-wall construction, single-wall carbon nanotubes are preferred for many applications.

Experiments and theory have shown that single-walled carbon nanotubes can be either metals or semiconductors, and their electrical properties can rival, or even exceed, the best metals or semiconductors known. The remarkable electrical properties of single-walled carbon nanotubes stem from the unusual electronic structure of the graphene. Nanotubes can be either conductors or semiconductors, depending on how the tube is rolled up.

Carbon nanotubes are grown by combining a source of carbon with a catalytic nanostructured material, such as iron or cobalt, at elevated temperatures. Sources of carbon employed to date include bulk graphite, hydrocarbons and carbon monoxide. At elevated temperatures, the catalyst has a high solubility for carbon. The carbon in the particle links up to form graphene and wraps around the catalyst to form a cylinder. Subsequent growth occurs from the continuous addition of carbon to the base of the tube at the nanoparticle/tube interface. Creating the proper conditions from growth can be done in a variety of ways, including bulk synthesis techniques, such as arc synthesis and laser assisted growth. An alternative technique is to grow the nanotubes directly on the substrate, for example, by using chemical vapor deposition.

Nanotubes may be rendered non-conductive through the application of electromagnetic radiation. The radiation may be applied in such a manner as to cause partial or full destruction of the tubular structure, resulting in a loss of bulk conductivity. Researchers have determined that single-walled nanotubes ignite when exposed to a conventional photographic flash, as described by Ajayan et al., "Nanotubes in a Flash—Ignition and Reconstruction", *Science*, Vol. 296, Apr. 26, 2002, the subject matter of which is herein incorporated by reference in its entirety. This photoeffect occurs for single-walled carbon nanotubes prepared by carbon arc, laser ablation, or chemical vapor deposition techniques upon expose to a camera flash at close range. Ignition and burning occur when local increases in temperature are sufficient to initiate the oxidation of the carbon and propagate as more heat is released by the exothermic reaction. Heat confinement in nanostructures can thus lead to drastic structural reformation and, under oxidizing environments, induce ignition under conditions not expected for bulk materials. The heat pulse is created by light absorption by the nanotubes from a proximal light flash.

Carbon nanotubes can be good conductors of electricity. They are currently used in lithium batteries, because their ability to conduct electricity facilitates recharging. Carbon nanotubes have also been suggested for use in electrochemical capacitors. U.S. Pat. No. 6,031,711 to Tennent et al., the subject matter of which is herein incorporated by reference in its entirety, discloses the use of graphitic nanofibers, including tubular fullerenes, nanotubes, and fibrils, which have been functionalized by chemical substitution, as electrodes in electrochemical capacitors.

Single-wall carbon nanotubes have also been suggested for use in molecular logic and memory devices. U.S. Pat. No. 6,423,583 to Avouris et al., the subject matter of which is herein incorporated by reference in its entirety, discloses a method of permanently modifying a single-wall carbon nanotube or a multi-wall carbon nanotube by using current induced electrical breakdown to eliminate individual nanotubes having a particular characteristic. The method is used to tailor properties of a composite nanotube by changing the proportion of component nanotubes. Similarly, published U.S. patent application Ser. No. 2002/0173083 A1 to Avouris et al., the subject matter of which is herein incorporated by reference in its entirety, discloses a method of electrically-induced breakdown of a plurality of stray nanotubes.

U.S. Pat. No. 6,472,705 to Bethune et al., the subject matter of which is herein incorporated by reference in its entirety, discloses the use of single-wall carbon nanotubes in microelectronic devices, such as Field effect transistors, wherein the insulating layer contains at least one closed cage molecule, such as fullerenes. Carbon nanotubes are defined as elongated fullerenes.

U.S. Pat. No. 6,420,092 to Yang et al., the subject matter of which is herein incorporated by reference in its entirety, discloses a fabrication method for a dielectric material with a low dielectric constant using a low dielectric constant nanotube. The inventors found that using a nanotube for a dielectric layer results in low dielectric constant because of the existence of pores throughout the structure of the nanotube. The nanotube was also found to have good thermal stability because it does not easily absorb moisture due to the low polarity of the nanotube wall. The inventors of the U.S. Pat. No. 6,420,092 patent determined that the formation of the dielectric layer with a nanotube stabilizes the quality of the dielectric layer.

Traditional electronic interconnection fabrication techniques for printed wiring boards require multiple processing steps. In addition, the density of electronic interconnections is practically limited by the ability of the composite material to dissipate heat. The inventor of the present invention has determined that the addition of single-walled carbon nanotubes to conventional composite substrate materials produces an improved composite material that enables the formation of circuits on the composite substrate material through a one-step exposure to electromagnetic radiation.

The use of the substrate material of the instant invention has an advantage over traditional electronic interconnection fabrication methods, because the process for forming circuits is a one-step exposure to electromagnetic radiation rather than the multi-step process used in conventional manufacturing. Another advantage to the use of the novel material of the invention is the density of electronic interconnections that can be achieved. Limits on conventional circuitry are imposed by material processing limits greater than the resolution of radiation sources. In contrast, the distance between conducting and non-conducting areas of the material formed by the instant invention is limited only by the resolution of the exposing radiation.

SUMMARY OF THE INVENTION

The present invention comprises a method of making a composite substrate material comprising an insulating dielectric material, fibrous reinforcing material and a conducting material, and subsequently selectively exposing the conducting material in the composite substrate material to electromagnetic radiation to render portions of the conducting material non-conducting. Preferably the conducting material consists of single-walled carbon nanotubes.

In an alternate embodiment, the carbon nanotubes function as both the conducting material and the fibrous reinforcing material.

DETAILED DESCRIPTION OF THE PREFERRED EMBODIMENTS OF THE INVENTION

The inventor has discovered that the addition of nanotubes to conventional composite substrate materials, comprising an insulating dielectric material and fibrous reinforcing material, produces a substrate that can be used to form a circuit in a printed wiring board in a one-step exposure to radiation, rather than the multi-step process used in conventional manufacturing.

The composite substrate material of the instant invention generally comprises an insulating dielectric material, a fibrous reinforcing material, and a conducting material. Other materials, including fillers may optionally be present in compositions of the instant invention.

The insulating dielectric material is generally selected from the group consisting of epoxy resins, polyamides, polyimides, tetrafluoroethylene (Teflon®), and liquid crystal materials. Other materials would also be known to those skilled in the art.

The fibrous reinforcing material is generally selected from the group consisting of glass fibers, carbon fibers, paper, and aromatic polyamide fibers, (i.e., Kevlar®). Other materials would also be known to those skilled in the art. The fibrous reinforcing material is generally present in the composition at a concentration of about 25 to about 75 percent by volume, preferably about 40 to about 50 percent by volume.

The conducting material in the composition generally comprises carbon (graphite) nanotubes. The carbon nanotubes are generally present in the composition at a concentration of about 40 to about 95 percent by volume, preferably about 70 to about 80 percent by volume.

In an alternative embodiment, the carbon nanotubes can also function as the fibrous reinforcing material due to their physical strength. In this instance, the carbon nanotubes are preferably present in the composition at a concentration of about 80 to about 99 percent by volume.

Various other components can also be utilized in compositions of the instant invention to achieve the desired result. Flow agents, such as surfactants and silanes can be included in compositions of the invention. Fillers, such as barium sulfate, can also be added.

The composite substrate material is selectively exposed to electromagnetic radiation in a negative pattern to that of an intended electronic interconnect circuit. Selective exposure of the composite substrate is accomplished by use of a laser or focused electron beam as the source of electromagnetic radiation or by exposing the composite substrate material though a phototool or photomask.

Upon exposure to electromagnetic radiation (i.e., light), the physical properties of the affected carbon nanotubes change and become nonconducting, thereby forming alternating areas of conducting and insulating substrate. The substrate can then be used as a circuit path, or as one layer comprising an electronic interconnection substrate. The electromagnetic radiation is applied in such a manner as to cause partial or full destruction of the tubular nanotube structure, resulting in a loss of bulk conductivity.

The composite substrate material may comprise one of a series of circuit layers that may subsequently be joined using traditional innerlayer connectivity methods, including lamination, via formation, and plated through hole formation. Other methods would also be known to one skilled in the art.

What is claimed is:

1. A method of fabricating an electronic interconnect device comprising the steps of:
   a) combining an insulating dielectric material, a fibrous reinforcing material, and a conducting material, wherein said conducting material comprises carbon nanotubes, to form a composite substrate material;
   b) selectively exposing said conducting material in said composite substrate material to electromagnetic radiation to render portions of the carbon nanotubes nonconducting;
thereby creating an electronic interconnect device.

2. A method according to claim 1, wherein said insulating dielectric material is selected from the group consisting of epoxy resins, polyimides, tetrafluoroethylene, and liquid crystal materials.

3. A method according to claim 1, wherein said fibrous reinforcing material is selected from the group consisting of glass fibers, carbon fibers, paper, and aromatic polyamide fibers.

4. A method according to claim 1, wherein said carbon nanotubes comprise single-walled carbon nanotubes.

5. A method according to claim 1, wherein said carbon nanotubes have a diameter of less than 100 nanometers.

6. A method to claim 1, wherein said carbon nanotubes are present in said composite substrate material in an amount of about 25 to about 75 percent by volume.

7. A method according to claim 1, wherein said carbon nanotubes are selectively rendered non-conductive by use of a laser, focused electron beam, or by exposure through a photomask.

8. A method according to claim 1, wherein both the fibrous reinforcing material and the conducting material comprise carbon nanotubes.

9. A method according to claim 5, wherein said carbon nanotubes have a diameter of less than 10 nanometers.

10. A method according to claim 6, wherein said carbon nanotubes are present in said composite substrate material in an amount of about 40 to about 50 percent by volume.

11. A method according to claim 7, wherein a distance between conducting and non-conducting areas of the composite substrate material is limited only by resolution of a source of electromagnetic radiation.

12. A method according to claim 8, wherein said carbon nanotubes are present in said composite substrate material in an amount of about 80 to about 99 percent by volume.

\* \* \* \* \*